United States Patent [19]

Weisenburger

[11] 4,085,394

[45] Apr. 18, 1978

[54] CONTACTLESS KEY SWITCH

[75] Inventor: Lawrence P. Weisenburger, Coeur D'Alene, Id.

[73] Assignee: Clare-Pendar Co., Post Falls, Id.

[21] Appl. No.: 732,377

[22] Filed: Oct. 14, 1976

[51] Int. Cl.² .......................................... H01F 21/00
[52] U.S. Cl. ..................................... 336/20; 331/65; 336/136
[58] Field of Search ................. 336/73, 20, 87, 130, 336/110, 131, 132, 136, 192; 334/71, 74, 75, 76; 331/117 R, 173, 181, 65

[56] References Cited

U.S. PATENT DOCUMENTS

| | | | |
|---|---|---|---|
| 1,533,749 | 4/1925 | Meirowsky | 336/20 |
| 1,836,808 | 12/1931 | Marrison | 336/20 |
| 2,240,849 | 5/1941 | Lubeke | 336/20 |
| 2,459,493 | 1/1949 | Bradford et al. | 336/20 X |
| 2,478,925 | 8/1949 | Jones | 336/20 |
| 2,855,571 | 10/1958 | Kleespies | 336/20 X |
| 3,719,902 | 3/1973 | Esterly | 336/73 X |
| 3,987,386 | 10/1976 | Valliere | 336/20 |

FOREIGN PATENT DOCUMENTS

| | | | |
|---|---|---|---|
| 162,029 | 1/1949 | Austria | 336/20 |
| 991,908 | 10/1951 | France | 336/20 |
| 1,201,227 | 12/1959 | France | 336/20 |
| 504,201 | 4/1939 | United Kingdom | 336/20 |

Primary Examiner—Thomas J. Kozma
Attorney, Agent, or Firm—Mason, Kolehmainen, Rathburn & Wyss

[57] ABSTRACT

A contactless key switch includes a manually operable actuating element mechanically coupled to a variable inductor fabricated from a resilient conductive material. The variable inductor biases the actuating element in an undepressed position, and depressing the actuating element compresses the variable inductor and changes its inductance. A detector circuit electrically coupled to the inductor senses the change in inductance and provides a signal indicating that the actuating element has been depressed.

8 Claims, 6 Drawing Figures

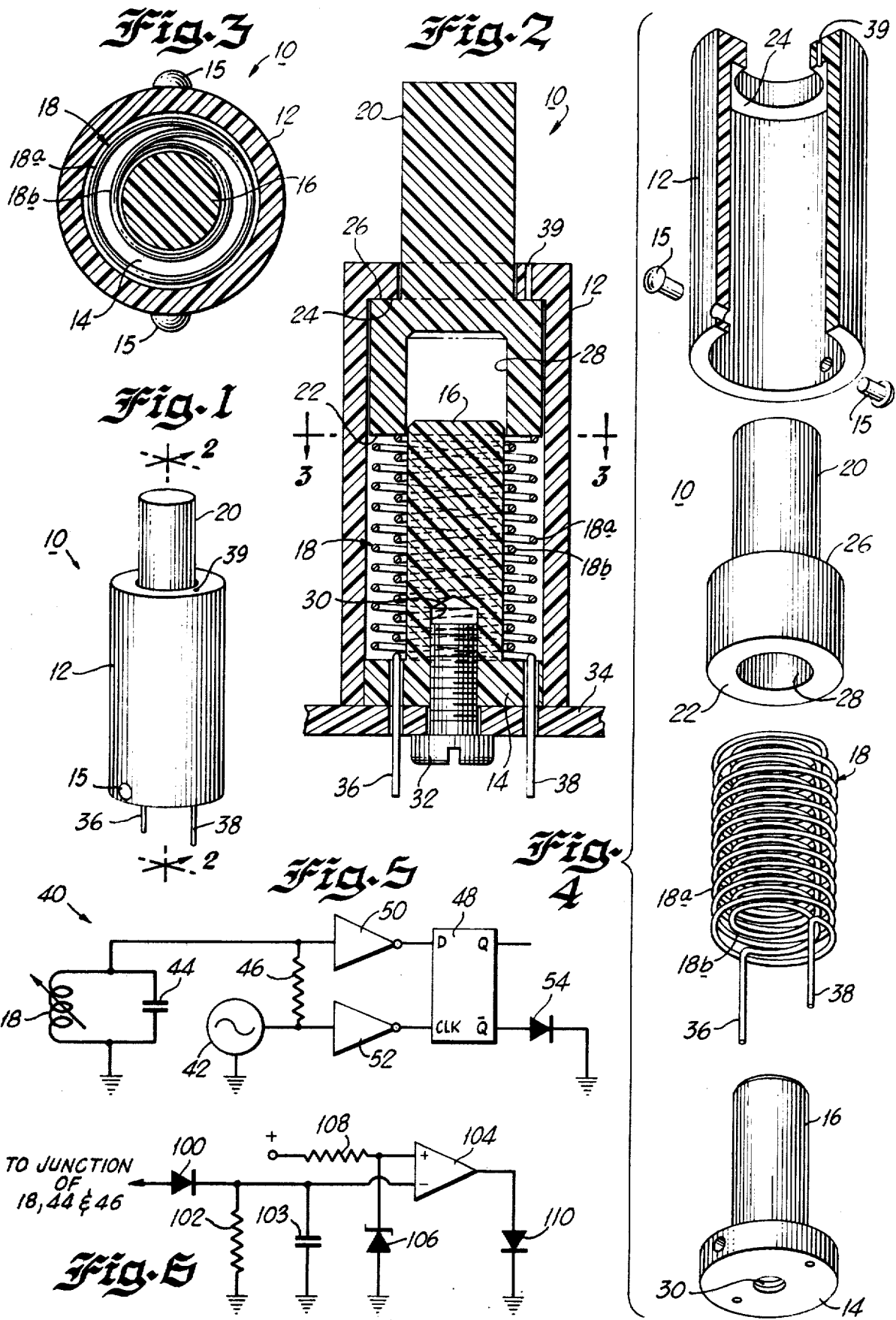

CONTACTLESS KEY SWITCH

BACKGROUND OF THE INVENTION

This invention relates generally to key switches, and more particularly, to contactless key switches.

One of the problems associated with key switches employing contacts is that the contacts tend to become dirty or oxidized and result in an erratic operation of the key switch. Consequently, contactless key switches have been developed in an effort to eliminate these problems. Two such contactless key switches are described in U.S. Pat. Nos. 2,881,402 and 3,719,902.

While the prior art key switches do eliminate most of the problems caused by erratic contact operation, the prior art key switches are rather complex. For example, the structures described in the two referenced patents utilize a transformer having primary and secondary windings and apparatus for altering the coupling between the windings when the key switch is depressed. The structure of the U.S. Pat. No. 2,881,402 employs apparatus for altering the relative position of the two windings to alter the coupling, and the U.S. Pat. No. 3,719,902 utilizes a shorted turn to reduce the Q of one of the windings. In both structures, a coil spring is used to bias the key switch in the undepressed position under normal conditions.

SUMMARY OF THE INVENTION

Accordingly, it is an object of the present invention to provide an improved contactless key switch that overcomes most of the problems associated with the prior art key switches.

It is another object of the present invention to provide a contactless key switch that is relatively simple and inexpensive to manufacture.

It is another object of the present invention to provide a simple key switch usable for keyboard applications.

It is yet another object of the present invention to provide an improved contactless key switch utilizing a single variable inductor having an inductance value that is altered upon the depression of the key switch.

It is still another object of the present invention to provide an improved key switch that utilizes a single coil fabricated from a resilient conductive material that serves both as the variable inductor and as a spring for mechanically biasing the key switch in an undepressed position.

In accordance with a preferred embodiment of the invention, a coil spring fabricated from a resilient conductive material is enclosed in a cylindrical housing. A manually operable actuating element, such as a push button, is mechanically coupled to the coil spring and is biased in a normally undepressed condition by the coil spring. A detector circuit is electrically coupled to the coil spring and is responsive to the inductance of the coil spring in order to provide an output signal indicating that the actuating element has been depressed.

These and other objects and advantages of the present invention will be readily apparent upon consideration of the following specification and drawings, wherein:

FIG. 1 is a perspective view of the key switch according to the invention;

FIG. 2 is a side sectional view of the key switch according to the invention taken along line 2—2 of FIG. 1;

FIG. 3 is a top sectional view of the key switch taken along line 3—3 of FIG. 2;

FIG. 4 is an exploded perspective view showing the internal construction of the key switch;

FIG. 5 is a combined block and schematic diagram of a detector circuit usable to detect the actuation of the key switch according to the invention; and FIG. 6 is a schematic diagram of an alternate embodiment of a circuit for detecting the actuation of the key switch according to the invention.

DETAILED DESCRIPTION OF THE PREFERRED EMBODIMENT

Referring now to the drawing, with particular attention to FIGS. 1-4, there is shown a key switch according to the invention generally designated by the reference numeral 10. The key switch 10 includes a housing 12, and a base 14 is secured within the housing 12. The base 14 may be secured in a variety of ways, such as by a pair of retaining pins 15, by an interference fit between the base 14 and the walls of the housing 12, by means of an adhesive, or by other methods. An elongated guide member 16 extends from the base 14 and serves to position a resilient coil spring 18 within the housing 12. A push button actuating member 20 is also partially positioned within the housing and includes a surface 22 that engages the coil spring 18. The dimensions of the coil spring 18 are such that the coil spring 18 exerts a biasing force on the surface 22 thereby biasing the push button actuating member 20 in a fully undepressed position. In this position, a surface 26 of the push button actuator 20 engages a surface 24 of the housing 12 to limit the range of travel of the actuator 20. A counter bore 28 within the actuating member 20 receives the elongated element 16 when the push button actuating element 20 is depressed. A threaded aperture 30 is provided within the base 14 and the elongated member 16 for receiving a screw 32 or other fastener so that the push button assembly 10 may be secured to a circuit board, such as the circuit board 34. A pair of leads 36 and 38 extend from the coil spring 18 through the space 14 and apertures in the circuit board 34 to provide electrical contact to the coil spring 18. A passageway 39 is formed in the top of the housing 12 to permit air to enter and escape the housing 12 when the actuator 20 is actuated.

The push button actuator 20, the housing 12, the base 14 and the elongated member 16 may be fabricated from an acrylic plastic or a suitable substitute. The coil spring 18 may be fabricated from stainless steel or any suitable resilient conductive material.

The coil spring 18 in the present invention comprises two concentric coils 18a and 18b electrically connected in series to increase the inductance of the coil. To further increase the inductance, the screw 32 may be fabricated from a ferromagnetic material, such as iron or steel. The screw 32 acts as a core for the coil spring 18, and increases its inductance, particularly when the coil spring 18 is fully compressed and the major portion of the coil spring 18 surrounds the screw 32. Thus, fabricating the screw 32 from a ferromagnetic material not only serves to increase the inductance of the coil spring 18, but also increases the change in inductance when the actuating element 20 is depressed. Alternatively, the screw 32 may be fabricated from a non-ferrous material, such as brass or copper, to provide a core that reduces the inductance of the coil spring 18, particularly when the element 20 is depressed.

A suitable circuit for detecting the change in inductance of the coil spring 18 is illustrated in FIG. 5, where the coil spring 18 is illustrated as the variable inductor 18. The detector circuit, generally designated by the reference numeral 40, comprises an oscillator 42 preferably oscillating at a radio frequency such as, for example, 1 mHz. The output of the oscillator 42 is coupled to a parallel combination of the inductor 18 and a capacitor 44 through a coupling resistor 46. A type D flip-flop 48, such as a type SN7474 manufactured by Texas Instruments, Incorporated, has its D input connected to the junction of the resistor 46, the capacitor 44 and the inductor 18 via an inverting amplifier 50. The clock input of the flip-flop 48 is connected to the output of the oscillator 42 via a second inverting amplifier 52. In the present embodiment, a type SN7404 integrated circuit manufactured by Texas Instruments, Incorporated is used for the inverting amplifiers 50 and 52, however, any suitable inverting amplifiers may be used. The Q output of the flip-flop 48 is used to drive a utilization circuit or an indicator such as a light emitting diode indicator 54. Ordinarily, a utilization circuit such as a typewriter or calculator input, or other circuit would be activated by the flip-flop 48, but the light emitting diode indicator 54 is shown to illustrate the operating principles of the present invention without excessive complexity.

In operation, the values of the capacitor 44 and the inductor 18 are chosen so that the parallel circuit formed by the inductor 18 and the capacitor 44 is in resonance when the push button actuator 20 is in the undepressed state. In practice the inductor 18 and the capacitor 44 may be tuned to the resonant state in a variety of ways. This may be achieved by selecting the value of the capacitor 44 so that it is resonant with the inductor 18 at the frequency of the oscillator 42, by utilizing a trimmer element such as an inductor or a capacitor (not shown) connected in parallel with the capacitor 44 and the inductor 18, or by adjusting the value of the inductor 18. The adjustment of the value of the inductor 18 may be readily achieved by adjusting the position of the screw 32 within the aperture 30. In such a case, the screw 32 would not ordinarily be used to attach the assembly 10 to the board 34, but alternate means, such as the leads 36 and 38 would be used. Alternatively, the frequency of the oscillator 42 could be adjusted until parallel resonance is achieved.

When the push button actuator 20 is in the undepressed state, and the combination of the inductor 18 and the capacitor 44 is in parallel resonance, the combination of the inductor 18 and capacitor 44 appears as a high, purely real, impedance. Since the impedance is purely real, the signals appearing at the output of the oscillator 42 and at the junction of the resistor 40 and the parallel resonant combination are in phase. Consequently, whenever a positive clock pulse from the oscillator 52 is applied to the clock input of the flip-flop 48, the D input from the amplifier 50 is also positive. This drives the $\overline{Q}$ output of the flip-flop 48 low and maintains the light emitting diode indicator 54 unenergized. If, however, the push button actuator 20 is depressed, the value of the inductor 18 increases, thereby rendering the parallel combination of the inductor 18 and the capacitor 44 inductive. Consequently, the signal across the parallel combination of the inductor 18 and the capacitor 44 leads the signal at the output of the oscillator 42 by 90°. This results in a logical zero being applied to the D input of the flip-flop 48 each time a clocking pulse is applied to the flip-flop 48 and causes the $\overline{Q}$ output of the flip-flop 48 to change to a high state and energizes the light emitting diode indicator 54.

In an alternative embodiment, the amplitude of the signal across the parallel combination of the inductor 18 and capacitor 44 can be used to indicate whether or not the push button actuator 20 is depressed. In such an embodiment, an amplitude detector would be connected to the junction of the resistor 46 and the capacitor 44 and inductor 18 in place of the phase detector. When the inductor 18 and capacitor 44 is in resonance, the high impedance of the parallel resonant combination causes a large amplitude signal to appear at the junction of the resistor 100, the capacitor 44 and inductor 18. Any shift away from resonance of the parallel combination resulting from a depression of the actuating element 20 results in a substantial drop in the voltage at the junction. This drop is detected by the amplitude detector.

An example of a circuit usable as an amplitude detector is a simple diode detector (FIG. 6) including a diode 100, a resistor 102 and a capacitor 103 connected to the inverting input of an operational amplifier 104. Other suitable amplitude detectors may also be used. The non-inverting input of the amplifier 104 is connected to a voltage reference such as a Zener diode 106 is selected so that when the circuit including the capacitor 44 and the inductor 18 is in resonance, the voltage across the tank circuit exceeds the breakdown voltage of the Zener diode 106, but when the push button actuator 20 is depressed, the voltage across the tank circuit is less than the breakdown voltage of the Zener diode 106. If the value of the Zener diode 106 is thus selected, a light emitting diode 110 is normally maintained in a non-energized state when the circuit is in resonance, and is energized when the push button actuator 20 is depressed.

Phase and amplitude detectors other than those illustrated can be used to detect the resonance of the tank circuit. In addition, the value of the inductor 18 and the capacitor 44 can be selected so that the parallel combination of the inductor 18 and capacitor 44 is resonant when the push button actuator 20 is depressed. Under such a condition, a lack of resonance indicates that the push button is not depressed and resonance indicates that the push button 20 is depressed. Also, a series resonant circuit rather than a parallel resonant circuit can be used in the detector circuit. A bridge circuit or other inductance measuring device not employing a resonant circuit may also be used to measure the change in inductance of the inductor 18 when the actuator 20 is depressed.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A variable inductance key switch assembly for use with an inductance responsive circuit comprising:
   a push button actuating element digitally operable to at least a first undepressed position and a second depressed position;
   variable inductor means for resiliently biasing said push button actuating element in said first undepressed position and for providing a first inductance value when said push button actuation element is in said first undepressed position and a second inductance value when said push button actuator is in said second depressed position, said variable inductor means including a compressible coil spring fabricated from a resilient electrically conductive material coupled to said push button actuating element and exerting a resilient biasing force on said push button actuating element for biasing said push button actuating element in said first undepressed position, said push button actuating element being digitally movable to said second depressed position against the resilient biasing force exerted by said coil spring and operative to compress said coil spring to alter the inductance of said coil spring, said coil spring having an inductance value related to the position of said actuating element;

means for supporting said push button actuating element and said coil spring; and means for providing an electrical connection to said coil spring.

2. A variable inductance key switch assembly as recited in claim 1 further including a second coil spring concentrically disposed within said coil spring and electrically connected in series with said coil spring.

3. A variable inductance key switch assembly as recited in claim 1 wherein said supporting means includes a housing containing said coil spring and at least a portion of said push button actuating element.

4. A variable inductance key switch assembly as recited in claim 3 wherein said housing includes an elongated member extending therefrom and extending through said coil spring.

5. A variable inductance key switch assembly as recited in claim 4 wherein said elongated member is positioned for engaging said push button actuating member when said push button actuating member is operated in said second depressed position thereby limiting the range of actuation of said push button actuating element.

6. A variable inductance key switch as recited in claim 5 further including means for fastening said key switch to a support, said fastening means including a fastener extending through said housing and into said elongated member.

7. A variable inductance key switch as recited in claim 5 further including means for altering the inductance of said coil spring, said inductance altering means including an elongated metallic member threadingly affixed to said housing and extending into said coil spring.

8. A variable inductance key switch as recited in claim 7 wherein said metallic member is fabricated from a ferromagnetic material.

* * * * *